United States Patent
Kojima

(10) Patent No.: US 7,068,082 B2
(45) Date of Patent: Jun. 27, 2006

(54) GATE DRIVING CIRCUIT AND SEMICONDUCTOR DEVICE

(75) Inventor: Tsutomu Kojima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/683,046

(22) Filed: Oct. 14, 2003

(65) Prior Publication Data

US 2005/0017787 A1    Jan. 27, 2005

(30) Foreign Application Priority Data

Jul. 25, 2003    (JP)    .............................. 2003-201594

(51) Int. Cl.
     *H03K 3/00*      (2006.01)

(52) U.S. Cl. ...................................... 327/108; 327/112

(58) Field of Classification Search ................ 327/427, 327/430, 432, 433, 434, 483
See application file for complete search history.

(56) References Cited

U.S. PATENT DOCUMENTS

| | | | |
|---|---|---|---|
| 5,625,312 A * | 4/1997 | Kawakami et al. | 327/483 |
| 6,411,133 B1 | 6/2002 | Matsudai et al. | 327/65 |
| 6,518,791 B1 | 2/2003 | Kojima et al. | 326/82 |
| 6,545,513 B1 * | 4/2003 | Tsuchida et al. | 327/108 |
| 6,720,819 B1 * | 4/2004 | Yamamoto | 327/427 |

FOREIGN PATENT DOCUMENTS

| | | |
|---|---|---|
| JP | 63-136820 | 6/1988 |
| JP | 4-19825 | 2/1992 |
| JP | 04-343517 | 11/1992 |
| JP | 06-338777 | 12/1994 |
| JP | 07-201188 | 8/1995 |
| JP | 10-013199 | 1/1998 |
| JP | 2000-059189 | 2/2000 |
| JP | 2000-286687 | 10/2000 |

* cited by examiner

*Primary Examiner*—My-Trang Nu Ton
*Assistant Examiner*—Hiep Nguyen
(74) *Attorney, Agent, or Firm*—Oblon, Spivak, McClelland, Maier & Neustadt, P.C.

(57) ABSTRACT

A gate driving circuit according to the present invention having, an output circuit which is connected to a first power supply terminal and a ground terminal and, upon receiving an ON/OFF signal, changes a level of a gate output terminal between a power supply voltage and a ground voltage, a shunt switching element which is connected between the gate output terminal and the ground terminal and is ON/OFF-controlled upon receiving a shunt control signal, and an output shunt control circuit which monitors the level of the gate output terminal and outputs the shunt control signal, wherein when the level of the gate output terminal decreases to not more than a first threshold value, the output shunt control circuit turns on the shunt switching element, and while the level is not more than a second threshold value larger than the first threshold value, the output shunt control circuit supplies the shunt control signal to said shunt switching element to maintain an ON state of the shunt switching element.

13 Claims, 5 Drawing Sheets

US 7,068,082 B2

GATE DRIVING CIRCUIT AND SEMICONDUCTOR DEVICE

CROSS REFERENCE TO RELATED APPLICATION

This application is based upon and claims benefit of priority under 35 USC 119 from the Japanese Patent Application No. 2003-201594, filed on Jul. 25, 2003, the entire contents of which are incorporated herein by reference.

BACKGROUND OF THE INVENTION

The present invention relates to a gate driving circuit and a semiconductor device and, more particularly, to a circuit which drives the gate of a switching element and a semiconductor device.

For example, a large current and high breakdown voltage are required for a device which uses a switching element such as an IGBT (Insulated Gate Bipolar Transistor) as the output stage to drive a motor. For such an application purpose of switching, the current density of the element increases, noise at the switching time poses a problem, and the element readily breaks when a load is short-circuited. To prevent these problems, the gate output level is moderately changed at gate off.

FIG. 5 shows the arrangement of a semiconductor device including a conventional gate driving circuit. At the output stage, the collectors and emitters of IGBTs 11 and 12 are connected in series between the voltage terminal and the ground terminal. The input terminal of a load 14 such as a motor is connected to an output terminal 13 as a connection point between the emitter of the IGBT 11 and the collector of the IGBT 12.

High- and low-side driving circuits are connected to the IGBTs 11 and 12, respectively. A low-side driving circuit 10 connected to the gate of the IGBT 12 will be described here.

An ON/OFF input signal is input from an external control system (not shown) to an input terminal 21 of the driving circuit 10. The input ON/OFF input signal is supplied to a high-side buffer stage 32 and low-side buffer stage 34 through a gate output control circuit 31.

A gate output high-level switching element 33 which has a switching element SW1 and resistor R1 connected in series with each other and a gate output low-level switching element 35 which has a resistor R2 and switching element SW2 connected in series with each other are connected in series between the voltage terminal and the ground terminal.

The ON/OFF signal is supplied to the switching elements SW1 and SW2 through the buffer stages 32 and 34. One of the switching elements SW1 and SW2 is turned on, and the other is turned off. ON/OFF control is thus executed. While the switching element SW1 is ON, and the switching element SW2 is OFF, a gate output signal of high level is generated at the connection point between the resistors R1 and R2. While the switching element SW1 is OFF, and the switching element SW2 is ON, a gate output signal of low level is generated.

The gate output signal is output from an output terminal 22 and supplied to the gate of the IGBT 12. When the gate output signal is high level, the IGBT 12 is turned on. When the gate output signal is low level, the IGBT 12 is turned off. In this way, the low-side IGBT 12 is ON/OFF-controlled. The level of the output terminal 13 is determined by the ON/OFF states of the IGBTs 11 and 12 and supplied to the load 14.

When the resistors R1 and R2 are arranged between the switching elements SW1 and SW2, the gate output moderately changes in rising to high level or dropping to low level. Hence, noise generation can be prevented when the IGBT 12 is ON/OFF-controlled and, more especially, turned off.

However, a parasitic capacitance CGCL is present between the emitter and the gate of the IGBT 12, as shown in FIG. 5. Assume that the gate output signal is low level, and the IGBT 12 is in the OFF state. For example, when the high-side IGBT 11 is turned on, and the voltage of the output terminal 13 varies, a displacement current flows through the parasitic capacitance CGCL so that noise is generated at the gate of the IGBT 12.

If the gate potential increases due to the influence of the noise, the IGBT 12 which should be in the OFF state is erroneously turned on. If the IGBT 12 is erroneously turned on, a through current flows between the IGBTs 11 and 12 which are in the ON state. Hence, the current consumption increases.

To prevent such an operation error, a conventional gate driving circuit shown in FIG. 6 has a gate output shunt switching element 70 such that the output terminal 22 is forcibly connected to the ground terminal while the IGBT 12 should be turned off. Accordingly, even when noise is generated at the output terminal 13, any increase in gate output signal is suppressed, and the IGBT 12 is prevented from erroneously being turned on.

A switching element SW3 of the gate output shunt switching element 70 is ON/OFF-controlled by an output shunt control circuit 50.

The output shunt control circuit 50 causes a comparator 62 to monitor the gate output level of the output terminal 22. When the gate output level drops to a reference voltage Vref (e.g., 2 V), the comparator 62 outputs an ON signal. This output is held by a latch circuit 63, output from an output terminal 52 as a shunt control signal, and supplied to the switching element SW3 through a buffer stage 64.

However, even this conventional gate driving circuit has the following problems.

As the first problem, the number of elements that constitute the comparator 62 is large, resulting in an increase in circuit area.

As the second problem, the elements that constitute the comparator 62 have a characteristic variation. To increase the accuracy of comparison with a reference voltage 61, the element size needs to be set large. This leads to an increase in circuit area and current consumption.

As the third problem, when the comparator 62 is used, the reference voltage 61 is necessary. To supply the reference voltage 61, an external or internal reference voltage generation circuit must be added. This also leads to an increase in area of the entire device.

As the fourth problem, the comparator 62 compares one reference voltage Vref with the gate output level. To prevent noise generation, preferably, the switching element SW3 for gate output shunt is turned on when the level of the output terminal 22 gradually drops and sufficiently becomes as low as, e.g., 2 V and is then set at the ground voltage.

Conversely, after the gate output of the output terminal 22 is at the off level, and the switching element SW3 for gate output shunt is temporarily turned on, the switching element SW3 is preferably prevented from being turned on even when the gate output increases such that the switching element SW3 maintains the ON state even when the level of the output terminal 22 increases due to noise.

For this purpose, a latch circuit is added to hold the OFF state. This also increases the area.

Known prior arts that disclose conventional gate driving circuits are as follows.

Japanese Patent Laid-Open No. 2002-43914 Japanese Patent Laid-Open No. 2001-16082 Japanese Patent Laid-Open No. 2000-286687 As described above, the conventional gate driving circuit has no sufficient measures against the through current due to noise. In addition, the number of elements that constitute an output shunt control circuit serving as a measure is large, resulting in an increase in circuit area and current consumption.

SUMMARY OF THE INVENTION

A gate drive circuit according to an aspect of the present invention comprises,
   an output circuit which is connected to a first power supply terminal and a ground terminal and, upon receiving an ON/OFF signal, changes a level of a gate output terminal between a power supply voltage and a ground voltage;
   a shunt switching element which is connected between the gate output terminal and the ground terminal and is ON/OFF-controlled upon receiving a shunt control signal; and
   an output shunt control circuit which monitors the level of the gate output terminal and outputs the shunt control signal,
   wherein when the level of the gate output terminal decreases to not more than a first threshold value, said output shunt control circuit turns on said shunt switching element, and while the level is not more than a second threshold value larger than the first threshold value, said output shunt control circuit supplies the shunt control signal to said shunt switching element to maintain an ON state of the shunt switching element.

A gate drive circuit according to an aspect of the present invention comprises, an output circuit which is connected to a first power supply terminal and a ground terminal and, upon receiving an ON/OFF signal, changes a level of a gate output terminal between a power supply voltage and a ground voltage;
   a shunt switching element which is connected between the gate output terminal and the ground terminal and is ON/OFF-controlled upon receiving a shunt control signal; and
   an output shunt control circuit which monitors the level of the gate output terminal and outputs the shunt control signal,
   wherein said output shunt control circuit comprises
   a threshold value setting circuit which has first and second P-channel transistors whose sources and drains are connected in series between a second power supply terminal and a first node and first and second N-channel transistors whose drains and sources are connected in series between the first node and the ground terminal,
   a third P-channel transistor whose source and drain are connected in series between a third power supply terminal and a second node and a third N-channel transistor whose drain and source are connected in series between the second node and the ground terminal, and
   a third resistor connected in series between the second node and the first node,
   wherein a gate of said first P-channel transistor and a gate of said first N-channel transistor are connected to the gate output terminal, a signal having a logic opposite to that of the shunt control signal is. supplied to a gate of said second P-channel transistor and a gate of said second N-channel transistor, a signal having the same logic as that of the shunt control signal is supplied to a gate of said third P-channel transistor and a gate of said third N-channel transistor, and a monitor signal is output from the first node, and
   a logic circuit which executes logic calculation upon receiving the monitor signal and the ON/OFF signal and outputs the shunt control signal.

A gate drive circuit according to an aspect of the present invention comprises, a high-side switching element having one terminal connected to a first power supply terminal and the other terminal connected to an output terminal to which a load can be connected;
   a low-side switching element having one terminal connected to the output terminal and the other terminal connected to a ground terminal; and
   a gate driving circuit which outputs a gate output from a gate output terminal to ON/OFF-control said low-side switching element,
   wherein said gate driving circuit comprises
   an output circuit which is connected to a second power supply terminal and a ground terminal and, upon receiving an ON/OFF signal, changes a level of a gate output terminal between a power supply voltage and a ground voltage,
   a shunt switching element which is connected between the gate output terminal and the ground terminal and is ON/OFF-controlled upon receiving a shunt control signal, and
   an output shunt control circuit which monitors the level of the gate output terminal and outputs the shunt control signal, and
   when the level of the gate output terminal decreases to not more than a first threshold value, said output shunt control circuit turns on said shunt switching element, and while the level is not more than a second threshold value larger than the first threshold value, said output shunt control circuit supplies the shunt control signal to said shunt switching element to maintain an ON state of the shunt switching element.

A gate drive circuit according to an aspect of the present invention comprises, a high-side switching element having one terminal connected to a first power supply terminal and the other terminal connected to an output terminal to which a load can be connected;
   a low-side switching element having one terminal connected to the output terminal and the other terminal connected to a ground terminal; and
   a gate driving circuit which outputs a gate output from a gate output terminal to ON/OFF-control said low-side switching element,
   wherein said gate driving circuit comprises
   an output circuit which is connected to a second power supply terminal and a ground terminal and, upon receiving an ON/OFF signal, changes a level of a gate output terminal between a power supply voltage and a ground voltage,
   a shunt switching element which is connected between the gate output terminal and the ground terminal and is ON/OFF-controlled upon receiving a shunt control signal, and
   an output shunt control circuit which monitors the level of the gate output terminal and outputs the shunt control signal, and
   said output shunt control circuit comprises a threshold value setting circuit which has first and second P-channel transistors whose sources and drains are connected in series between a third power supply terminal and a first node and first and second N-channel transistors whose drains and sources are connected in series between the first node and the ground terminal, a third P-channel transistor whose source and drain are connected in series between a fourth power supply terminal and a second node and a third N-channel transistor whose drain and source are connected in series between the second node and the ground terminal, and a third resistor connected in series between the second node and the first node, wherein a gate of said first P-channel transistor and a gate of said first N-channel transistor are connected to the gate output terminal, a signal having a logic opposite to that of the shunt control signal is supplied to a gate of said second P-channel transistor and a gate of said second N-channel transistor, a signal having the same logic as that of the shunt control signal is supplied to a gate of said third P-channel transistor and a gate of said third N-channel transistor, and a monitor signal is output from the first node, and a logic circuit which executes logic calculation upon receiving the monitor signal and the ON/OFF signal and outputs the shunt control signal.

BRIEF DESCRIPTION OF THE DRAWINGS

FIG. 3 is a circuit diagram showing the arrangement of an equivalent circuit when the shunt control signal output from the output shunt control circuit in the gate driving circuit switches from OFF to ON;

FIG. 4 is a circuit diagram showing the arrangement of an equivalent circuit when the shunt control signal output from the output shunt control circuit in the gate driving circuit switches from OFF to ON;

DESCRIPTION OF THE PREFERRED EMBODIMENT

The embodiment of the present invention will be described below with reference to the accompanying drawings.

Figure 1:
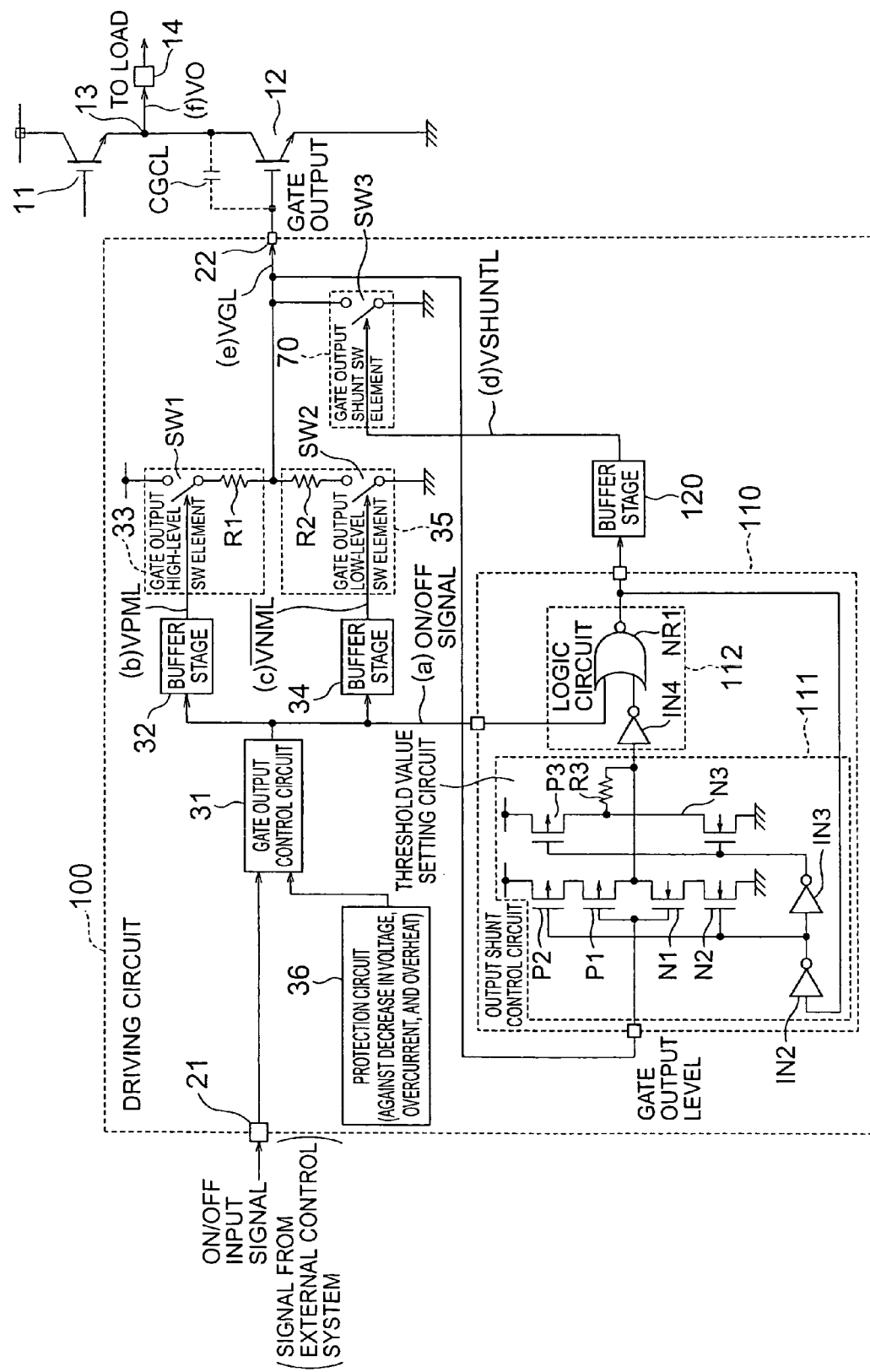
FIG. 1 is a circuit diagram showing the arrangement of a semiconductor device including a gate driving circuit according to an embodiment of the present invention.

FIG. 1 shows the arrangement of a semiconductor device including a gate driving circuit according to this embodiment.

The collectors and emitters of IGBTs 11 and 12 are connected in series between the voltage terminal and the ground terminal. The input terminal of a load 14 such as a motor is connected to an output terminal 13 as a connection point between the emitter of the IGBT 11 and the collector of the IGBT 12. High- and low-side driving circuits are connected to the IGBTs 11 and 12, respectively. A low-side driving circuit 100 connected to the gate of the IGBT 12 will be described here.

An ON/OFF input signal is input from an external control system (not shown) to an input terminal 21 of the driving circuit 100. The ON/OFF input signal is supplied to a high-side buffer stage 32 and low-side buffer stage 34 through a gate output control circuit 31. The gate output control circuit 31 has a protection circuit 36 to prevent the circuit from being broken due to a decrease in voltage, an overcurrent, or overheat.

A gate output high-level switching element 33 which has a switching element SW1 and resistor R1 connected in series with each other and a gate output low-level switching element 35 which has a resistor R2 and switching element SW2 connected in series with each other are connected in series between the voltage terminal and the ground terminal.

The ON/OFF signal is supplied to the switching elements SW1 and SW2 through the buffer stages 32 and 34. One of the switching elements SW1 and SW2 is turned on, and the other is turned off. ON/OFF control is thus executed. While the switching element SW1 is ON, and the switching element SW2 is OFF, a gate output VGL of high level is generated at the connection point between the resistors R1 and R2. While the switching element SW1 is OFF, and the switching element SW2 is ON, the gate output VGL of low level is generated.

The gate output VGL is output from a gate output terminal 22 and supplied to the gate of the IGBT 12. When the gate output signal is high level, the IGBT 12 is turned on. When the gate output signal is low level, the IGBT 12 is turned off. In this way, the low-side IGBT 12 is ON/OFF-controlled. The level of an output VO at the output terminal 13 is determined by the ON/OFF states of the IGBTs 11 and 12 and supplied to the load 14.

When the resistors R1 and R2 are arranged between the switching elements SW1 and SW2, the gate output moderately changes in rising to high level or dropping to low level. Hence, noise generation can be prevented when the IGBT 12 is ON/OFF-controlled and, more especially, turned off.

The gate output terminal 22 has a gate output shunt switching element 70. A switching element SW3 is connected between the gate output terminal 22 and the ground terminal. The switching element SW3 is ON/OFF-controlled by an output shunt control circuit 110.

To ON/OFF-control the switching element SW3, the output shunt control circuit 110 has a threshold value setting circuit 111 which sets two threshold values necessary for monitoring the gate output VGL and a logic circuit 112 which executes logic calculation between the monitor output from the threshold value setting circuit 111 and the ON/OFF signal from the gate output control circuit 31 and outputs a shunt control signal.

In the threshold value setting circuit 111, the sources and drains of P-channel transistors P1 and P2 are connected in series between the voltage terminal and the ground terminal. In addition, the drains and sources of N-channel transistors N1 and N2 are connected in series. The gate output VGL from the gate output terminal 22 is input to the gates of the transistors P1 and N1. The output from the logic circuit 112 is inverted by an inverter IN2 and input to the gates of the transistors P2 and N2.

The source and drain of a P-channel transistor P3 and the drain and source of an N-channel transistor N3 are connected in series between the voltage terminal and the ground terminal. The output from the logic circuit 112 is input to the gates of the transistors P3 and N3 through the inverter IN2 and an inverter IN3.

The connection point of the transistors P1 and N1 is connected to the output terminal of the threshold value setting circuit. The connection point of the transistors P3 and N3 is connected to the output terminal through a resistor R3.

The output from the threshold value setting circuit 111 is inverted by an inverter IN4 in the logic circuit 112 and then connected to one input terminal of a NOR circuit NR1. The ON/OFF signal from the gate output control circuit 31 is input to the other input terminal. The output from the NOR circuit NR1 is input to the inverter IN2. The output from the NOR circuit NR1 is also amplified by a buffer stage 120 and supplied to the gate output shunt switching element 70 as a shunt control signal.

Figure 2:
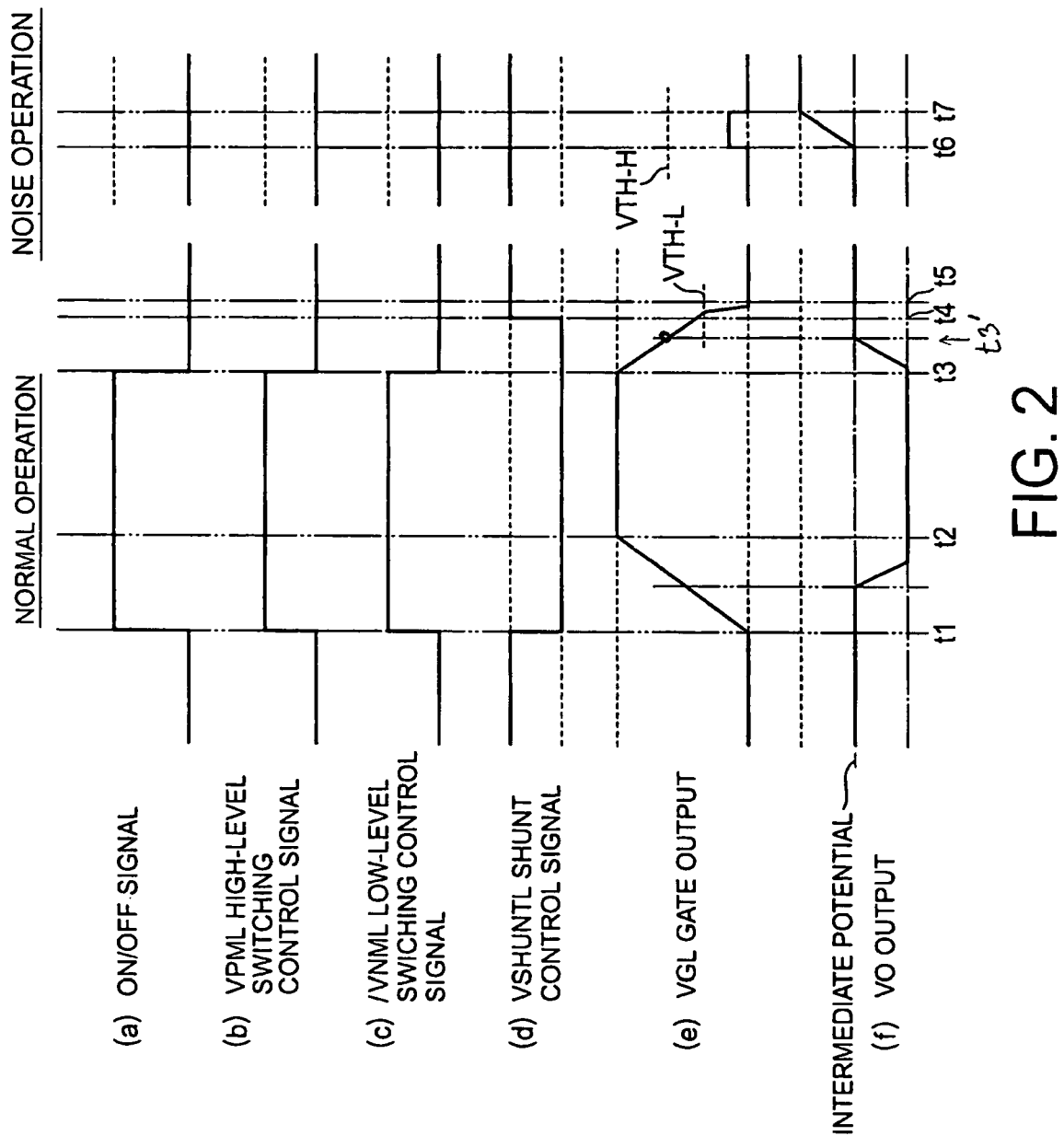
FIG. 2 is a timing chart showing the waveforms of nodes in the gate driving circuit.

The operation of this embodiment having the above arrangement will be described with reference to FIG. 2. The timing chart shown in FIG. 2 shows changes in waveforms of (a) the ON/OFF signal output from the gate output control circuit 31, (b) a high-level switching control signal VPML which is output from the buffer stage 32 and supplied to the high-level switching element SW1, (c) a low-level switching control signal/VNML which is output from the buffer stage 34 and supplied to the low-level switching element SW2, (d) a shunt control signal VSHUNTL output from the buffer stage 120 and supplied to the shunt switching element SW3, (e) the gate output VGL output from the output terminal 22, and (f) the output signal VO from the output terminal 13.

(1) ON Operation of IGBT 12 in Normal Operation Mode Without Noise

When an ON/OFF signal of high level (ON signal) is output from the gate output control circuit 31, the high-level switching control signal VPML of active high is output to the high-level switching element SW1 through the buffer stage 32. On the other hand, the low-level switching control signal /VNML of active low, which has a high-level, is output to the low-level switching element SW2 through the buffer stage 34.

Accordingly, the switching element SW1 is turned on, and the switching element SW2 is turned off. Due to the function of the gate resistor R1, the level of the gate output VGL moderately increases from times t1 to t2.

During this time, the shunt control signal VSHUNTL is at low level, and the shunt switching element SW3 is in the OFF state. Accordingly, the gate output VGL reaches high level at time t2 and maintains predetermined level until time t3.

(2) OFF Operation of IGBT 12 in Normal Operation Mode Without Noise When an ON/OFF signal of low level (OFF signal) is output from the gate output control circuit 31, the low-level switching control signal /VNML of active low, which has a low-level is output to the low-level switching element SW2 through the buffer stage 34 to turn on the switching element SW2. The high-level switching element SW1 is turned off.

As a result, due to the function of the gate resistor R2, the level of the gate output VGL moderately decreases from times t3 to t4.

Figure 3:
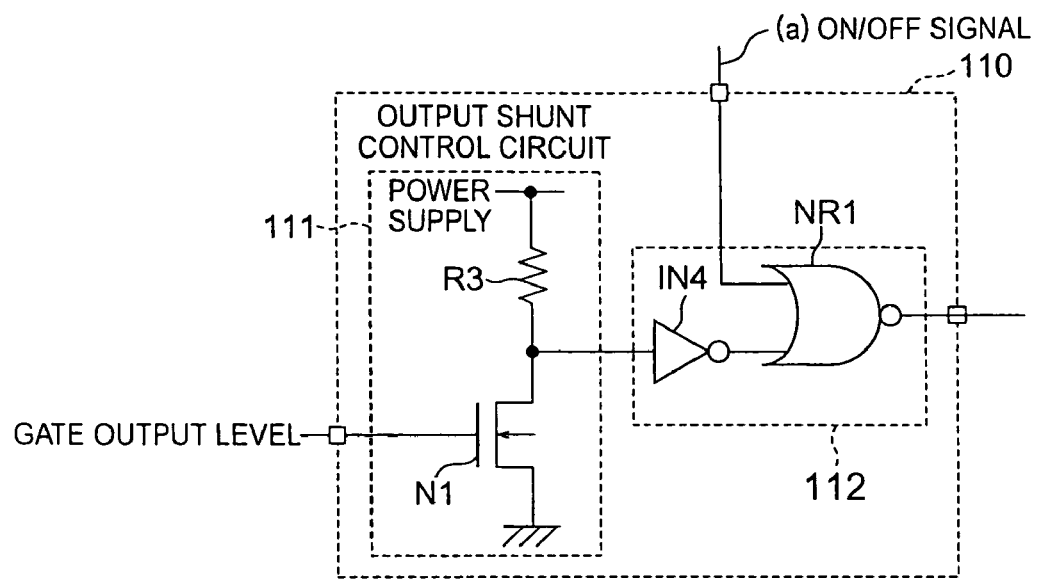

The threshold value setting circuit 111 of the output shunt control circuit 110 has the arrangement of an equivalent circuit shown in FIG. 3 in the initial state (from times t1 to t4). At this time, the threshold value setting circuit 111 has a relatively low threshold value Vth-L (e.g., about 2 to 3 V), i.e., the threshold value of the transistor N1, which is determined by the characteristics of the resistor R3 and transistor N1.

More specifically, while the gate output VGL is at a level equal to or more than the threshold value Vth-L, the low-level output shunt control signal VSHUNTL is inverted by the inverter IN2 in accordance with the gate output. Accordingly, the transistor P2 is turned off to invalidate the transistor P1 while the transistor N1 is turned on. The transistor N2 is in the ON state because the low-level output shunt signal is inverted by the inverter IN2, and a high-level signal is input to the gate of the transistor N2.

The transistor P3 is in the ON state because a low-level signal obtained such that the output from the inverter IN2 is inverted by the inverter IN3 is input to the gate of the transistor P3. The transistor N3 is in the OFF state.

As a result, as shown in FIG. 3, the resistor R3 and the drain and source of the transistor N1 are connected in series between the voltage terminal and the ground terminal. The output from the connection point between the resistor R3 and the drain of the transistor N1 is input to the logic circuit 112.

As described above, the transistor N1 whose gate receives the gate output VGL is pulled up by the resistor R3.

From times t1 to t4, the transistor N1 is in the ON state, and the low-level output is input to the logic circuit 112. A high-level signal is input from the inverter IN4 to one input terminal of the NOR circuit NR1. A high-level ON/OFF signal is input to the other input terminal of the NOR circuit NR1. The NOR circuit NR1 outputs a low-level output shunt signal. Hence, the shunt control signal VSHUNTL changes to low level, and the switching element SW3 is in the OFF state.

From time t4, when the gate output VGL becomes less than the threshold value Vth-L, and the transistor N1 of the threshold value setting circuit 111 is turned off, the input to the inverter IN4 is inverted to low level. The shunt control signal VSHUNTL output from the NOR circuit NR1 changes to high level, and the switching element SW3 is turned on.

As a consequence, the gate output VGL is forcibly connected to the ground terminal and abruptly drops to the ground level from times t4 to t5.

From time t4, the operation state of the output shunt control circuit 110 is switched. In this case, in the threshold value setting circuit 111, the shunt control signal VSHUNTL of high level is inverted by the inverter IN2 and input to the gates of the transistors P2 and N3. The transistor N2 is turned off to invalidate the transistor N1 while the transistor P2 is turned on. In addition, a high-level signal is input from the inverter IN3 to the gates of the transistors P3 and N3 so that the transistor P3 is turned off, and the transistor N3 is turned on.

Figure 4:
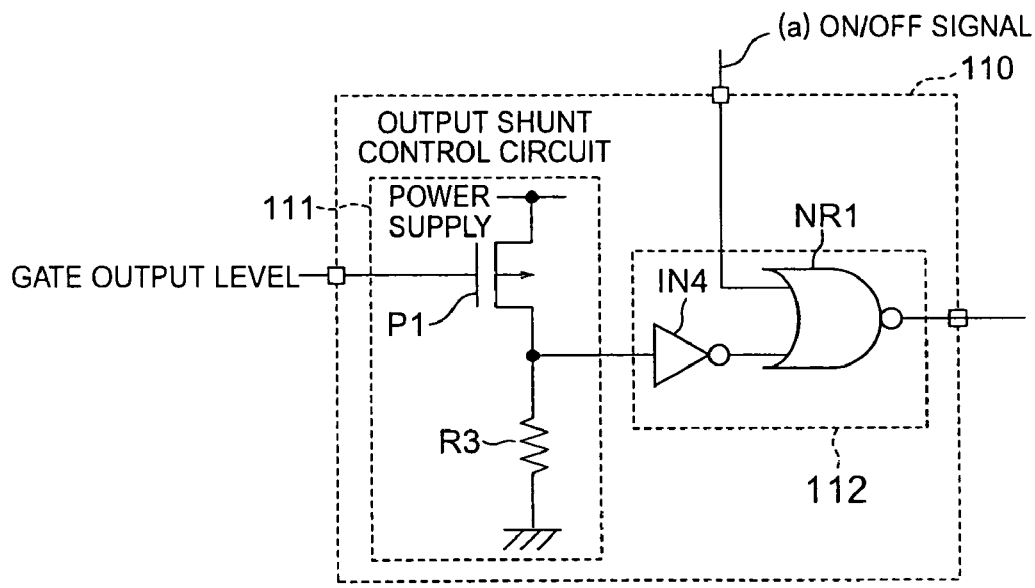
Figure 5:
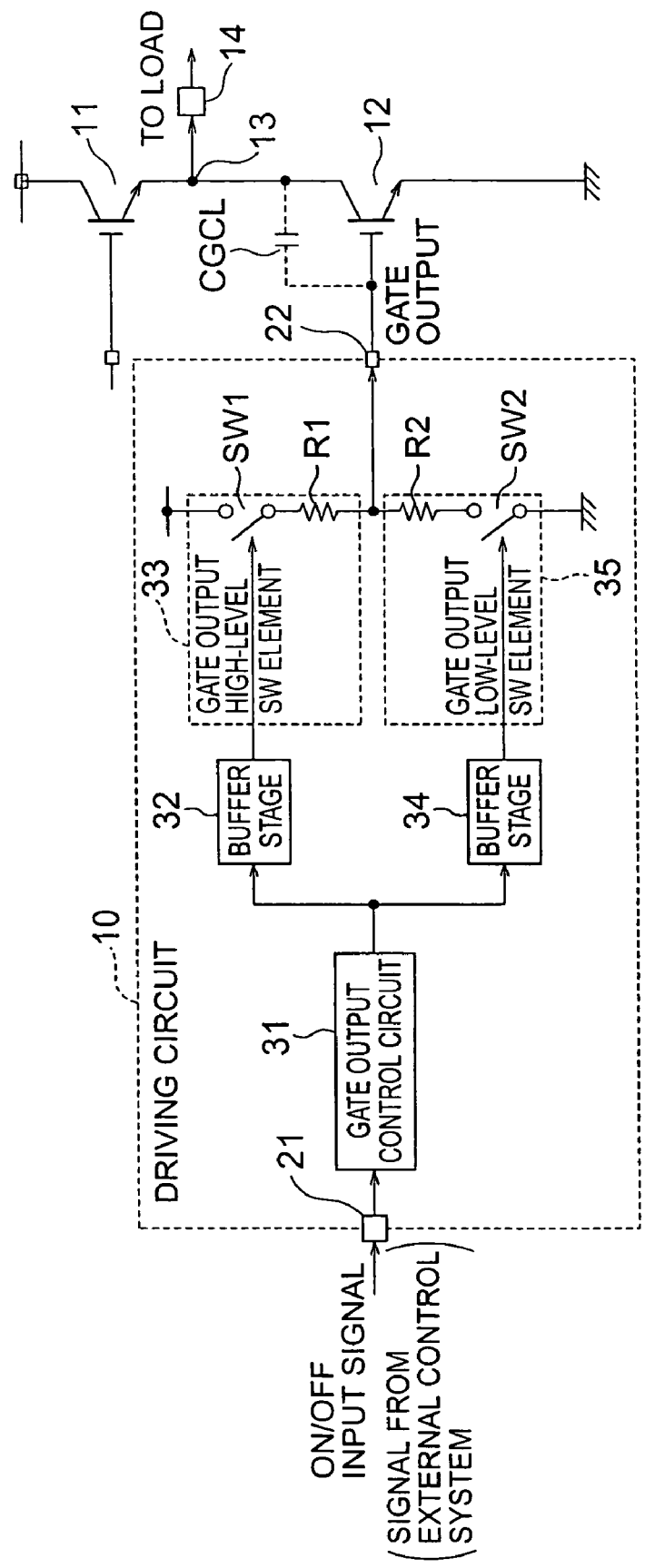
FIG. 5 is a circuit diagram showing the arrangement of a semiconductor device including a conventional gate driving circuit.

As a result, as shown in FIG. 4, the transistor P1 whose gate receives the level of the gate output VGL is operated while pulled down by the resistor R3.

In this case, a threshold value Vth-H is the threshold value of the P-channel transistor p1,which is determined by the power supply voltage and the characteristics of the resistor R3 and transistor P1, For example, when the power supply voltage is 15 V, 2 to 3 V is subtracted from 15 V so that the threshold value Vth-H becomes about 12 to 13 V. As described above, after a shunt on state is temporarily set, the threshold value can be set to the threshold value Vth-H that is relatively higher than the threshold value Vth-L when the shunt off state is changed to the shunt on state.

Since the potential of the gate output VGL is low level, the transistor P1 is turned on. A high-level signal is input to the input terminal of the inverter IN4 and inverted. A thus inverted low-level signal is input to one input terminal of the NOR circuit NR1. A low-level ON/OFF signal is input to the other input terminal. Accordingly, the high-level shunt control signal VSHUNTL is output from the NOR circuit NR1 and supplied to the switching element SW3 through the buffer stage 120 so that the switching element SW3 is turned on. With this operation, the gate output VGL is forcibly connected to the ground terminal.

(3) Operation When Potential of Gate Output Terminal 22 Increases upon Receiving Noise in Gate Output Off Mode Assume a case wherein the potential of the output signal VO varies because, e.g., the high-side IGBT 11 is turned on while the gate output VGL is at low level (from time t5). Assume that a displacement current flows through the parasitic capacitance CGCL, and noise is generated to increase the potential of the gate output VGL from times t6 to t7.

Even in this case, since the threshold value Vth-H of the threshold value setting circuit 111 is set as high as, e.g., 13 V, the shunt control signal VSHUNTL can hold high level as far as the level of the gate output VGL is equal to or less than the threshold value Vth-H.

As a result, the shunt control signal VSHUNTL maintains high level. The gate output VGL is continuously kept forcibly connected to the ground terminal by the switching element SW3. Hence, any increase in voltage is suppressed.

As described above, when the switching element SW3 that shunts the gate output VGL is to be changed from the OFF state to the ON state, the threshold value Vth-L of the threshold value setting circuit 111 is set to be sufficiently small. The level of the gate output VGL is gradually reduced by the function of the resistor R2 until it becomes sufficiently low, thereby preventing noise. When the switching element SW3 is then turned on, the gate output VGL can be shunted.

On the other hand, after the switching element SW3 that shunts the gate output VGL is temporarily turned on, the threshold value Vth-H of the threshold value setting circuit 111 is set to be sufficiently large in consideration of the effect of the expected potential variation. With this setting, the state wherein the gate output VGL is shunted can be maintained even when noise is generated. Hence, any situation in which the gate output VGL is erroneously set in the ON state to turn on the IGBT 12 simultaneously with the high-side IGBT 11, and a through current flows can be avoided.

Figure 6:
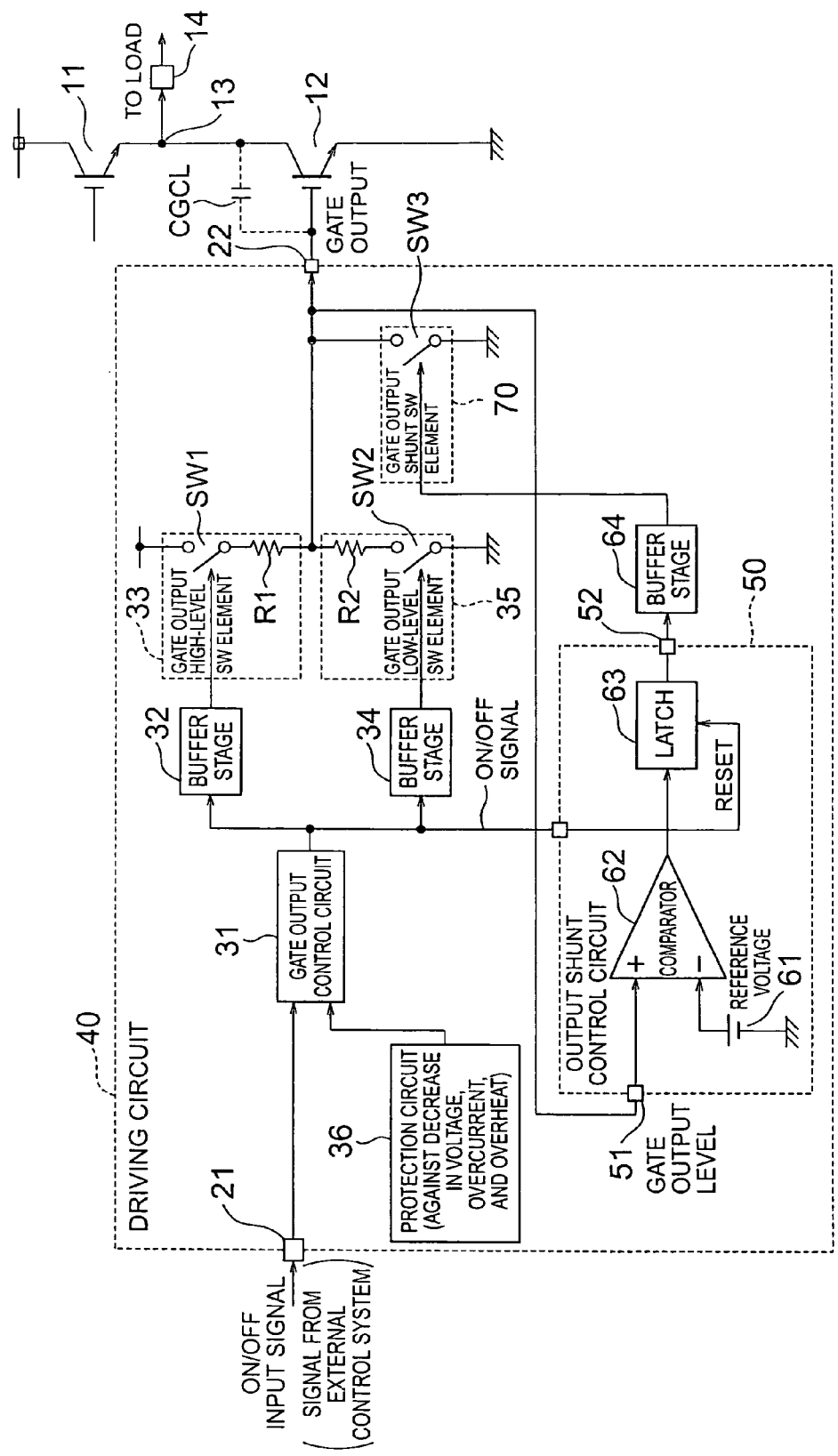
FIG. 6 is a circuit diagram showing the arrangement of a semiconductor device including another conventional gate driving circuit.

According to this embodiment, the following effects can be obtained as compared to the gate driving circuit shown in FIG. 6.

As the first effect, no comparator is used in the output shunt control circuit 110. Hence, the number of elements can be decreased as compared to the conventional circuit using a comparator, and the circuit area can be reduced.

As the second effect, when a comparator is used, the element size needs to be set large to increase the accuracy of comparison with a reference voltage in consideration of the characteristic variation between the elements. In this embodiment, however, the output shunt control circuit 110 can have a simple structure including MOS transistors and resistors. In addition, since no accurate comparison with one threshold value is necessary, the element size need not be large. For these reasons, the circuit area and current consumption can be reduced.

As the third effect, when a comparator is used, supply of a reference voltage is necessary. For this purpose, a reference voltage generation circuit must be added. In this embodiment, however, such a circuit need not be prepared. Hence, any increase in area of the entire device can be prevented.

As the fourth effect, in the conventional circuit using a comparator, one reference voltage is compared with the level of the gate output. Hence, a latch circuit must be added for a sufficient measure against a through current due to noise, as described above. This leads to an increase in area.

In this embodiment, however, the two threshold values Vth-L and Vth-H are set. In monitoring the level of the gate output, a hysteresis characteristic can be obtained. Hence, any operation error due to noise or generation of a through current can reliably be prevented without using a latch circuit.

The threshold values Vth-L and Vth-H can be set to desired values by setting the sizes of the N-channel transistor N1 and P-channel transistor P1 and the resistance value of the resistor R3 in the equivalent circuits shown in FIGS. 3 and 4.

The above-described embodiment is merely an example and does not limit the present invention. Various changes and modifications can be made within the technical scope of the present invention. For example, the circuit arrangement of the threshold value setting circuit 111 or logic circuit 112 in FIG. 1 is not limited to that illustrated, and various changes and modifications can be made.

As described above, the gate driving circuit and semiconductor device according to the above embodiment can sufficiently prevent generation of a through current due to noise and also suppress any increase in circuit area and current consumption.

What is claimed is:

1. A gate driving circuit comprising:

an output circuit which is connected to a first power supply terminal and a ground terminal and, upon receiving an ON/OFF signal, changes a level of a gate output terminal between a power supply voltage and a ground voltage;

a shunt switching element which is connected between the gate output terminal and the ground terminal and is ON/OFF-controlled upon receiving a shunt control signal; and an output shunt control circuit which monitors the level of the gate output terminal and outputs the shunt control signal, wherein said output shunt control circuit comprises:

a threshold value setting circuit which has first and second P-channel transistors whose sources and drains are connected in series between a second power supply terminal and a first node, and first and second N-channel transistors whose drains and sources are connected in series between the first node and the ground terminal, a third P-channel transistor whose source and drain are connected in series between a third power supply terminal and a second node, and a third N-channel transistor whose drain and source are connected in series between the second node and the ground terminal, and a third resistor connected in series between the second node and the first node, wherein a gate of said first P-channel transistor and a gate of said first N-channel transistor are connected to the gate output terminal, a signal having a logic opposite to that of the shunt control signal is supplied to a gate of said second P-channel transistor and a gate of said second N-channel transistor, a signal having the same logic as that of the shunt control signal is supplied to a gate of said third P-channel transistor and a gate of said third N-channel transistor, and a monitor signal is output from the first node, and a logic circuit which executes logic calculation upon receiving the monitor signal and the ON/OFF signal and outputs the shunt control signal.

2. A circuit according to claim 1, wherein said logic circuit comprises,
   an inverter which receives the monitor signal, inverts the monitor signal, and outputs the inverted monitor signal, and
   a NOR circuit which receives an output from said inverter and the ON/OFF signal, executes NOR calculation, and outputs the shunt control signal.

3. A circuit according to claim 1, when the ON/OFF signal indicates OFF, said logic circuit outputs the shunt control signal that represents a logic based on the monitor signal.

4. A circuit according to claim 1, wherein said output circuit comprises,
   a first switching element and a first resistor, which are connected in series between the first power supply terminal and the gate output terminal, and controlled upon receiving the ON/OFF signal, and
   a second switching element and a second resistor, which are connected in series between the gate output terminal and the ground terminal, and controlled upon receiving the ON/OFF signal.

5. A semiconductor device comprising:
   a high-side switching element having one terminal connected to a first power supply terminal and the other terminal connected to an output terminal to which a load can be connected;
   a low-side switching element having one terminal connected to the output terminal and the other terminal connected to a ground terminal; and
   a gate driving circuit which outputs a gate output from a gate output terminal to ON/OFF-control said low-side switching element, wherein said gate driving circuit comprises
   an output circuit which is connected to a second power supply terminal and a ground terminal and, upon receiving an ON/OFF signal, changes a level of a gate output terminal between a power supply voltage and a ground voltage,
   a shunt switching element which is connected between the gate output terminal and the ground terminal and is ON/OFF-controlled upon receiving a shunt control signal, and
   an output shunt control circuit which monitors the level of the gate output terminal and outputs the shunt control signal, and
   when the level of the gate output terminal decreases to not more than a first threshold value higher than ground level, said output shunt control circuit turns on said shunt switching element, and after turning on said shunt switching element to be in an ON-state and while the level is not more than a second threshold value larger than the first threshold value, said output shunt control circuit supplies the shunt control signal to said shunt switching element to maintain an ON state of the shunt switching element,
   wherein said output shunt control circuit comprises
   a threshold value setting circuit which has first and second P-channel transistors whose sources and drains are connected in series between a third power supply terminal and a first node, and first and second N-channel transistors whose drains and sources are connected in series between the first node and the ground terminal,
   a third P-channel transistor whose source and drain are connected in series between a fourth power supply terminal and a second node, and a third N-channel transistor whose drain and source are connected in series between the second node and the ground terminal, and
   a third resistor connected in series between the second node and the first node,
   wherein a gate of said first P-channel transistor and a gate of said first N-channel transistor are connected to the gate output terminal, a signal having a logic opposite to that of the shunt control signal is supplied to a gate of said second P-channel transistor and a gate of said second N-channel transistor, a signal having the same logic as that of the shunt control signal is supplied to a gate of said third P-channel transistor and a gate of said third N-channel transistor, and a monitor signal obtained by comparing the level of the gate output terminal with one of the first and second threshold values is output from the first node, and
   a logic circuit which executes logic calculation upon receiving the monitor signal and the ON/OFF signal and outputs the shunt control signal.

6. A device according to claim 11, wherein said output circuit comprises
   a first switching element and a first resistor, which are connected in series between the first power supply terminal and the gate output terminal, and controlled upon receiving the ON/OFF signal, and
   a second switching element and a second resistor, which are connected in series between the gate output terminal and the ground terminal, and controlled upon receiving the ON/OFF signal.

7. A circuit according to claim 5 wherein said logic circuit comprises,
   an inverter which receives the monitor signal, inverts the monitor signal, and outputs the inverted monitor signal, and
   a NOR circuit which receives an output from said inverter and the ON/OFF signal,
   executes NOR calculation, and outputs the shunt control signal.

8. A circuit according to claim 5 when the ON/OFF signal indicates OFF, said logic circuit outputs the shunt control signal that represents a logic based on the monitor signal.

9. A circuit according to claim 5 wherein said output circuit comprises,
   a first switching element and a first resistor, which are connected in series between the first power supply terminal and the gate output terminal, and controlled upon receiving the ON/OFF signal, and
   a second switching element and a second resistor, which are connected in series between the gate output terminal and the ground terminal, and controlled upon receiving the ON/OFF signal.

10. A semiconductor device comprising:
    a high-side switching element having one terminal connected to a first power supply terminal and the other terminal connected to an output terminal to which a load can be connected;
    a low-side switching element having one terminal connected to the output terminal and the other terminal connected to a ground terminal; and
    a gate driving circuit which outputs a gate output from a gate output terminal to ON/OFF-control said low-side switching element,
    wherein said gate driving circuit comprises
    an output circuit which is connected to a second power supply terminal and a ground terminal and, upon receiving an ON/OFF signal, changes a level of a gate output terminal between a power supply voltage and a ground voltage, a shunt switching element which is connected between the gate output terminal and the ground terminal and is ON/OFF-controlled upon receiving a shunt control signal, and an output shunt control circuit which monitors the level of the gate output terminal and outputs the shunt control signal, and said output shunt control circuit comprises a threshold value setting circuit which has first and second P-channel transistors whose sources and drains are connected in series between a third power supply terminal and a first node, and first and second N-channel transistors whose drains and sources are connected in series between the first node and the ground terminal, a third P-channel transistor whose source and drain are connected in series between a fourth power supply terminal and a second node, and a third N-channel transistor whose drain and source are connected in series between the second node and the ground terminal, and a third resistor connected in series between the second node and the first node, wherein a gate of said first P-channel transistor and a gate of said first N-channel transistor are connected to the gate output terminal, a signal having a logic opposite to that of the shunt control signal is supplied to a gate of said second P-channel transistor and a gate of said second N-channel transistor, a signal having the same logic as that of the shunt control signal is supplied to a gate of said third P-channel transistor and a gate of said third N-channel transistor, and a monitor signal is output from the first node, and a logic circuit which executes logic calculation upon receiving the monitor signal and the ON/OFF signal and outputs the shunt control signal.

11. A circuit according to claim 10 wherein said logic circuit comprises, an inverter which receives the monitor signal, inverts the monitor signal, and outputs the inverted monitor signal, and a NOR circuit which receives an output from said inverter and the ON/OFF signal, executes NOR calculation, and outputs the shunt control signal.

12. A circuit according to claim 10 when the ON/OFF signal indicates OFF, said logic circuit outputs the shunt control signal that represents a logic based on the monitor signal.

13. A circuit according to claim 10 wherein said output circuit comprises, a first switching element and a first resistor, which are connected in series between the first power supply terminal and the gate output terminal and controlled upon receiving the ON/OFF signal, and a second switching element and a second resistor, which are connected in series between the gate output terminal and the ground terminal and controlled upon receiving the ON/OFF signal.

* * * * *